US012598965B2

(12) United States Patent
Hou et al.

(10) Patent No.: US 12,598,965 B2
(45) Date of Patent: Apr. 7, 2026

(54) 3D NAND MEMORY DEVICE WITH ISOLATION TRENCHES AND FABRICATION METHOD THEREOF

(71) Applicant: YANGTZE MEMORY TECHNOLOGIES CO., LTD., Wuhan (CN)

(72) Inventors: Huidan Hou, Wuhan (CN); Lan Yao, Wuhan (CN); Yanwei Shi, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 667 days.

(21) Appl. No.: 17/854,477

(22) Filed: Jun. 30, 2022

(65) Prior Publication Data

US 2023/0063917 A1      Mar. 2, 2023

Related U.S. Application Data

(63) Continuation of application No. PCT/CN2021/115613, filed on Aug. 31, 2021.

(51) Int. Cl.
| | |
|---|---|
| *H01L 21/762* | (2006.01) |
| *H01L 21/306* | (2006.01) |
| *H01L 21/311* | (2006.01) |
| *H01L 21/768* | (2006.01) |
| *H10B 41/40* | (2023.01) |

(Continued)

(52) U.S. Cl.
CPC .......... *H10W 10/014* (2026.01); *H10B 41/40* (2023.02); *H10B 43/40* (2023.02); *H10P 50/642* (2026.01); *H10P 50/73* (2026.01);

*H10W 10/17* (2026.01); *H10W 20/051* (2026.01); *H10D 84/0188* (2025.01); *H10D 84/038* (2025.01)

(58) Field of Classification Search
CPC ......... H01L 21/76224; H01L 21/30604; H01L 21/31144; H01L 21/76859; H01L 21/3081; H01L 21/3083; H01L 21/76229; H10B 41/40; H10B 43/40; H10D 84/0188; H10D 84/038
See application file for complete search history.

(56) References Cited

U.S. PATENT DOCUMENTS

| | | | |
|---|---|---|---|
| 6,207,534 B1 * | 3/2001 | Chan ................. | H01L 21/76229 |
| | | | 438/424 |
| 6,559,029 B2 * | 5/2003 | Hur ................... | H01L 21/76229 |
| | | | 257/E21.548 |

(Continued)

FOREIGN PATENT DOCUMENTS

| | | |
|---|---|---|
| CN | 101924025 A | 12/2010 |
| CN | 102916024 A | 2/2013 |
| JP | 2006041397 A | 2/2006 |

*Primary Examiner* — Maliheh Malek
(74) *Attorney, Agent, or Firm* — BAYES PLLC

(57) ABSTRACT

The present disclosure discloses a semiconductor device and a fabrication method thereof. In the method, firstly etching a substrate in a first device region to form at least one first trench and then etching the substrate in both first device region and second device region to form at least one first isolation trench at the positions corresponding to the at least one first trench and form at least one second isolation trench in the second device region. Herein a depth of the first isolation trench is larger than that of the second isolation trench.

19 Claims, 8 Drawing Sheets

<u>10</u>

(51) Int. Cl.

| | | |
|---|---|---|
| *H10B 43/40* | (2023.01) |
| *H10P 50/00* | (2026.01) |
| *H10P 50/64* | (2026.01) |
| *H10W 10/00* | (2026.01) |
| *H10W 10/17* | (2026.01) |
| *H10W 20/00* | (2026.01) |
| *H10D 84/01* | (2025.01) |
| *H10D 84/03* | (2025.01) |

(56) References Cited

U.S. PATENT DOCUMENTS

| | | | | |
|---|---|---|---|---|
| 7,271,060 | B2 * | 9/2007 | Sandhu | H01L 21/76229 |
| | | | | 438/257 |
| 7,396,738 | B1 * | 7/2008 | Lee | H10B 41/44 |
| | | | | 257/E21.549 |
| 7,811,935 | B2 * | 10/2010 | Sandhu | H10B 41/42 |
| | | | | 257/E21.546 |
| 7,858,490 | B2 * | 12/2010 | Mitsuhira | H10B 41/40 |
| | | | | 257/E21.546 |
| 7,935,595 | B2 * | 5/2011 | Shiratake | H10B 12/09 |
| | | | | 438/257 |
| 8,058,176 | B2 * | 11/2011 | Park | H01L 21/31116 |
| | | | | 438/735 |
| 8,227,339 | B2 * | 7/2012 | Ponoth | H01L 23/5226 |
| | | | | 257/E21.548 |
| 8,652,931 | B1 * | 2/2014 | Luo | H10F 39/807 |
| | | | | 438/424 |
| 8,703,604 | B2 * | 4/2014 | Ponoth | H01L 21/76816 |
| | | | | 257/E21.548 |
| 9,305,825 | B2 * | 4/2016 | Youn | H01L 21/763 |
| 10,008,531 | B2 * | 6/2018 | Chou | H01L 21/76237 |
| 10,431,630 | B2 * | 10/2019 | Boivin | H10N 70/011 |
| 11,075,291 | B1 * | 7/2021 | Dainese | H10D 12/038 |
| 11,342,217 | B1 * | 5/2022 | Wei | H01L 21/76224 |
| 11,430,795 | B2 * | 8/2022 | Kim | H01L 21/76229 |
| 11,647,622 | B2 * | 5/2023 | Cheng | H10D 84/834 |
| | | | | 257/296 |
| 11,664,438 | B2 * | 5/2023 | Lee | H01L 21/3081 |
| | | | | 257/401 |
| 2003/0034511 | A1 * | 2/2003 | Hurley | H10B 41/43 |
| | | | | 257/296 |
| 2004/0023499 | A1 * | 2/2004 | Hellig | H01L 21/76816 |
| | | | | 438/694 |
| 2004/0029385 | A1 * | 2/2004 | Manger | H01L 21/3083 |
| | | | | 438/689 |
| 2004/0092115 | A1 * | 5/2004 | Hsieh | H01L 21/3081 |
| | | | | 257/E21.232 |
| 2005/0093047 | A1 | 5/2005 | Goda et al. | |
| 2005/0106871 | A1 * | 5/2005 | Yu | H01L 21/3065 |
| | | | | 257/E21.549 |
| 2005/0250284 | A1 * | 11/2005 | Park | H10D 84/0135 |
| | | | | 257/E29.267 |
| 2005/0287731 | A1 * | 12/2005 | Bian | H10D 30/6891 |
| | | | | 438/257 |
| 2006/0008993 | A1 * | 1/2006 | Song | H10B 41/40 |
| | | | | 257/E27.081 |
| 2006/0220171 | A1 * | 10/2006 | Choi | H01L 21/76229 |
| | | | | 257/500 |
| 2006/0292793 | A1 * | 12/2006 | Sandhu | H10B 12/09 |
| | | | | 438/257 |
| 2009/0072355 | A1 * | 3/2009 | Cheng | H01L 21/76229 |
| | | | | 257/622 |
| 2009/0236684 | A1 * | 9/2009 | Lee | H10B 41/40 |
| | | | | 257/E29.02 |
| 2009/0261479 | A1 * | 10/2009 | Hong | H01L 21/31144 |
| | | | | 257/775 |
| 2010/0173470 | A1 * | 7/2010 | Lee | H01L 21/02343 |
| | | | | 257/E21.548 |
| 2012/0292694 | A1 * | 11/2012 | Hsieh | H10D 30/0295 |
| | | | | 438/270 |
| 2013/0149837 | A1 * | 6/2013 | Sawada | H01L 21/02337 |
| | | | | 438/427 |
| 2014/0051222 | A1 * | 2/2014 | Terahara | H10D 84/0172 |
| | | | | 438/296 |
| 2014/0349464 | A1 * | 11/2014 | Yang | H01L 21/3081 |
| | | | | 438/427 |
| 2015/0279879 | A1 * | 10/2015 | Chou | H01L 21/76237 |
| | | | | 257/446 |
| 2016/0133742 | A1 * | 5/2016 | Okuda | H01L 23/49562 |
| | | | | 438/270 |
| 2017/0178968 | A1 * | 6/2017 | Zhou | H10D 84/038 |
| 2019/0214391 | A1 * | 7/2019 | Yoon | H10B 12/315 |
| 2020/0365598 | A1 * | 11/2020 | Chen | H01L 21/308 |
| 2024/0332062 | A1 * | 10/2024 | Huang | H10D 30/031 |
| 2025/0194169 | A1 * | 6/2025 | Pandey | H10D 64/117 |

* cited by examiner

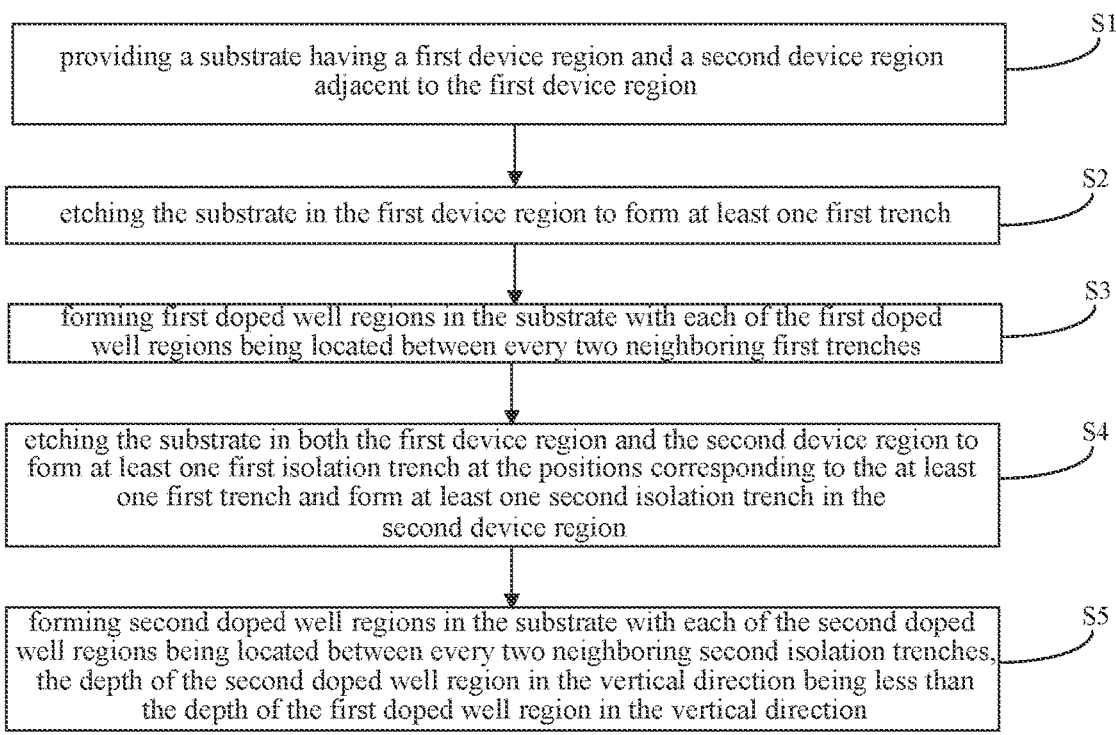

| | |
|---|---|
| providing a substrate having a first device region and a second device region adjacent to the first device region | S1 |
| etching the substrate in the first device region to form at least one first trench | S2 |
| forming first doped well regions in the substrate with each of the first doped well regions being located between every two neighboring first trenches | S3 |
| etching the substrate in both the first device region and the second device region to form at least one first isolation trench at the positions corresponding to the at least one first trench and form at least one second isolation trench in the second device region | S4 |
| forming second doped well regions in the substrate with each of the second doped well regions being located between every two neighboring second isolation trenches, the depth of the second doped well region in the vertical direction being less than the depth of the first doped well region in the vertical direction | S5 |

Fig. 1

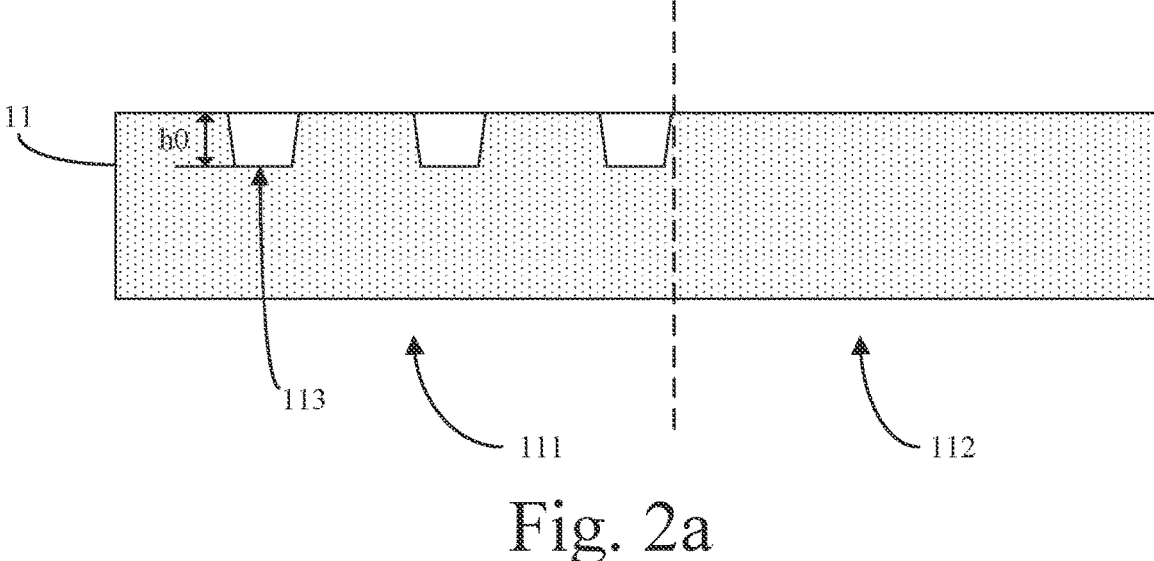

Fig. 2a

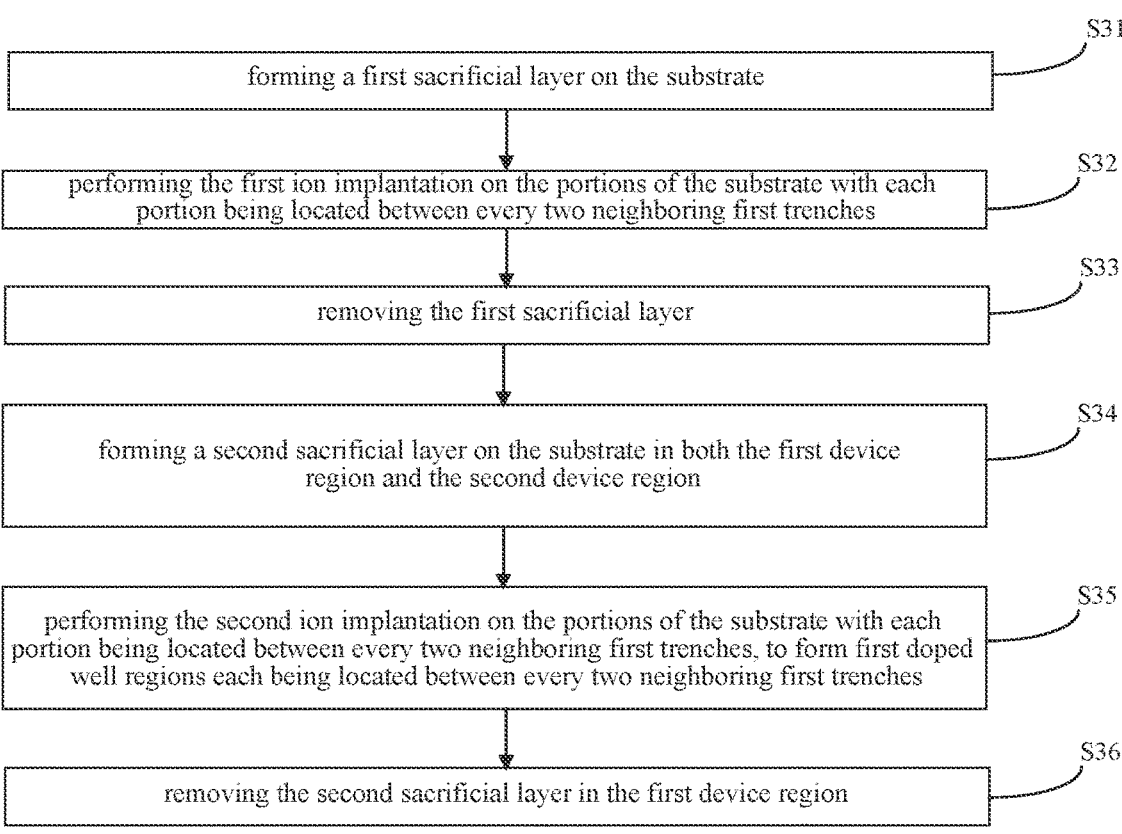

| | S31 |
| forming a first sacrificial layer on the substrate | | performing the first ion implantation on the portions of the substrate with each portion being located between every two neighboring first trenches — S32 removing the first sacrificial layer — S33 forming a second sacrificial layer on the substrate in both the first device region and the second device region — S34 performing the second ion implantation on the portions of the substrate with each portion being located between every two neighboring first trenches, to form first doped well regions each being located between every two neighboring first trenches — S35 removing the second sacrificial layer in the first device region — S36

Fig. 3

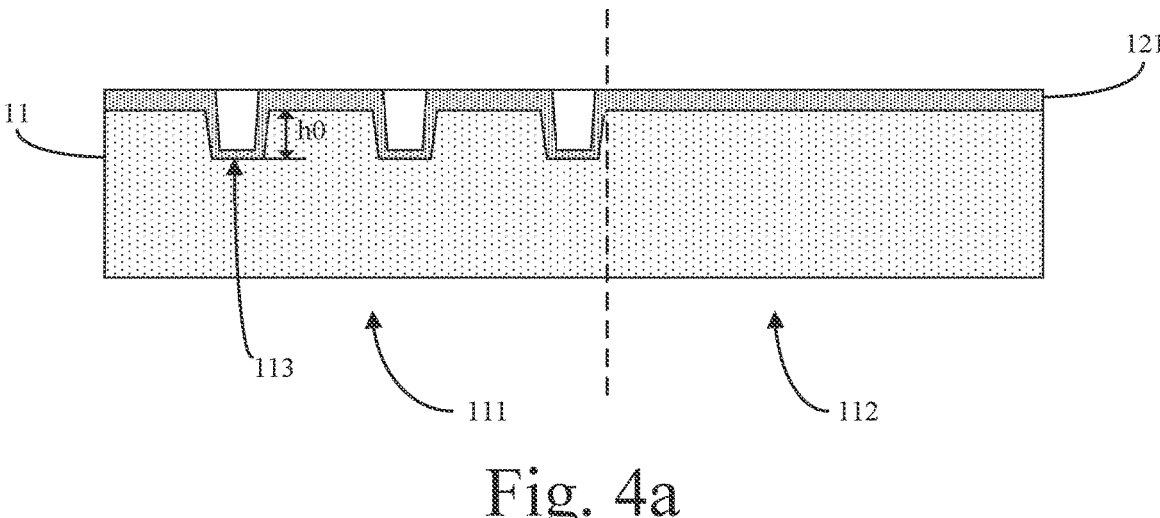

Fig. 4a

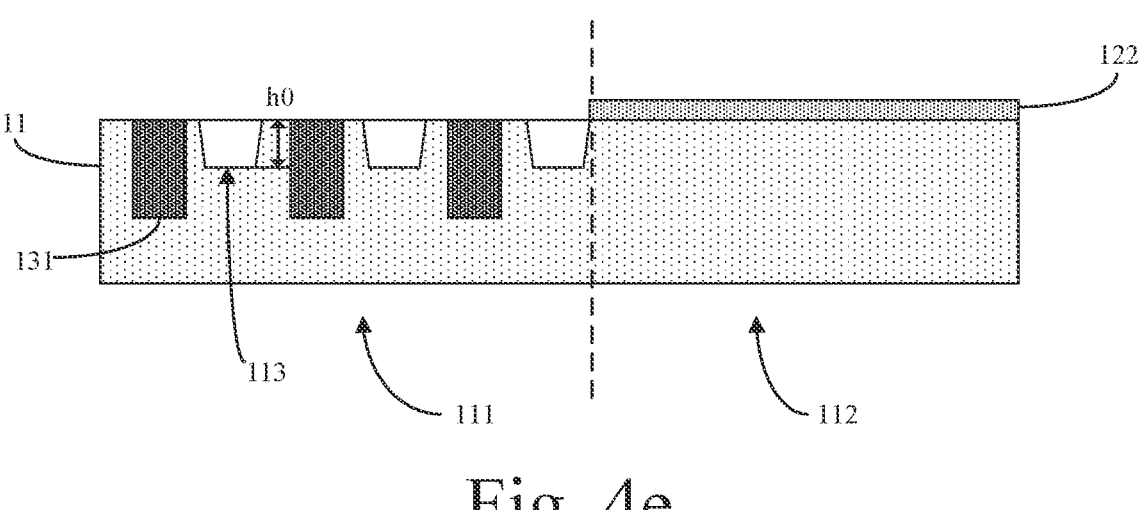

Fig. 4e

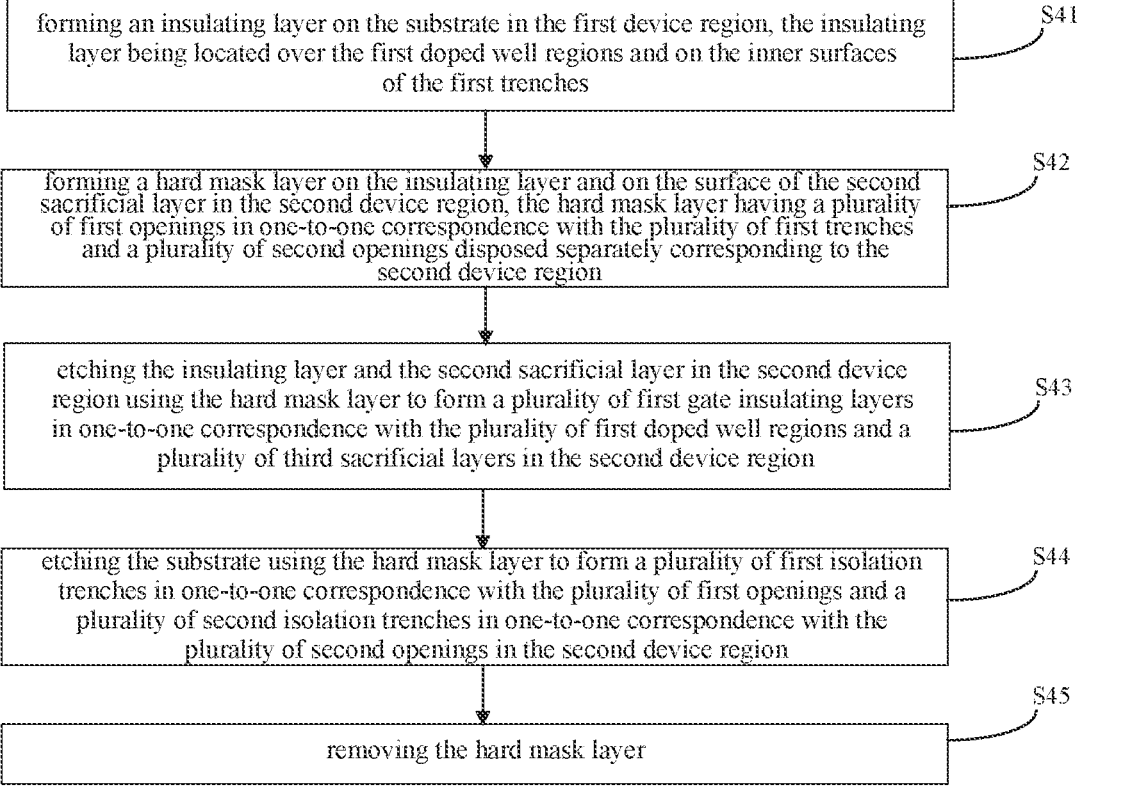

| | |
|---|---|
| forming an insulating layer on the substrate in the first device region, the insulating layer being located over the first doped well regions and on the inner surfaces of the first trenches | S41 |
| forming a hard mask layer on the insulating layer and on the surface of the second sacrificial layer in the second device region, the hard mask layer having a plurality of first openings in one-to-one correspondence with the plurality of first trenches and a plurality of second openings disposed separately corresponding to the second device region | S42 |
| etching the insulating layer and the second sacrificial layer in the second device region using the hard mask layer to form a plurality of first gate insulating layers in one-to-one correspondence with the plurality of first doped well regions and a plurality of third sacrificial layers in the second device region | S43 |
| etching the substrate using the hard mask layer to form a plurality of first isolation trenches in one-to-one correspondence with the plurality of first openings and a plurality of second isolation trenches in one-to-one correspondence with the plurality of second openings in the second device region | S44 |
| removing the hard mask layer | S45 |

Fig. 5

3D NAND MEMORY DEVICE WITH ISOLATION TRENCHES AND FABRICATION METHOD THEREOF

CROSS-REFERENCE TO RELATED APPLICATIONS

This application is a continuation of International Application No. PCT/CN2021/115613, filed on Aug. 31, 2021, which is incorporated herein by reference in its entirety.

BACKGROUND

The present disclosure generally relates to electronics, and more particularly to a semiconductor device and a fabrication method thereof.

As non-volatile memory products with low power consumption, light weight and good performance, NAND memory devices are widely applied in electronic products. NAND devices of planar structures have reached their limit in actual scalability. In order to further increase memory capacity and reduce memory cost per bit, three dimensional (3D) NAND memories are proposed. In a 3D NAND memory architecture, memory cells are arranged in multiple levels stacked vertically to achieve a stacked memory architecture.

A 3D NAND memory also includes a control chip, which generally uses Complementary Metal Oxide Semiconductor (CMOS). High Voltage Metal Oxide Semiconductor (HV-MOS) transistors and Low Voltage Metal Oxide Semiconductor (LVMOS) transistors often co-exist in CMOS. There may also exist Low Low Voltage Metal Oxide Semiconductor (LLVMOS) transistors in CMOS. The voltage for LLVMOS is even lower than the voltage for LVMOS.

In current 3D NAND processes, isolation structures (e.g., Shallow Trench Isolation, STI) for HVMOS, LVMOS and LLVMOS devices are all formed with the same depth that satisfies the requirements of HVMOS. That may cause the isolation structures for LVMOS/LLVMOS devices being deeper than what they require, which imposes constraints on footprints of the LVMOS/LLVMOS devices, preventing the footprints of the LVMOS/LLVMOS devices from further reduction and thus imposing constraints on footprints for CMOS.

SUMMARY

In one aspect, a method for fabricating a semiconductor device is disclosed. A substrate having a first device region and a second device region is provided. The substrate is etched in the first device region to form at least one first trench. The substrate is etched in both the first device region and the second device region to form at least one first isolation trench at the positions corresponding to the at least one first trench and form at least one second isolation trench in the second device region. A depth of the first isolation trench in a vertical direction perpendicular to the substrate is larger than a depth of the second isolation trench in the vertical direction.

In some implementations, a width of the first isolation trench and a width of the second isolation trench in a lateral direction parallel to the substrate decrease respectively in a direction away from a surface of the substrate. The width of the second isolation trench at a top of the second isolation trench is larger than the width of the first isolation trench at a top of the first isolation trench.

In some implementations, the difference between the depth of the first isolation trench and the depth of the second isolation trench is equal to a depth of the first trench in the vertical direction.

In some implementations, the number of the first trench, the first isolation trench and the second isolation trench are plurality respectively. The first trench, the first isolation trench and the second isolation trench are disposed separately from each other. The plurality of first trenches are in one-to-one correspondence with the plurality of first isolation trenches. After etching the substrate in the first device region, first doped well regions are formed in the substrate with each of the first doped well regions being located between two adjacent first trenches.

In some implementations, a first sacrificial layer is formed on the substrate. A first ion implantation is performed on the portions of the substrate with each portion being located between two adjacent first trenches. The first sacrificial layer is removed. A second sacrificial layer is formed on the substrate at both the first device region and the second device region. A second ion implantation is performed on the portions of the substrate with each portion being located between two adjacent first trenches, to form the first doped well regions being located between two adjacent first trenches. The second sacrificial layer in the first device region is removed.

In some implementations, an insulating layer is formed on the substrate in the first device region. The insulating layer is located over the first doped well regions and on the inner surfaces of the first trenches. A hard mask layer is formed on the insulating layer and on the surface of the second sacrificial layer in the second device region. The hard mask layer has a plurality of first openings in one-to-one correspondence with the plurality of first trenches and a plurality of second openings disposed separately corresponding to the second device region. The insulating layer and the second sacrificial layer in the second device region are etched using the hard mask layer to form a plurality of first gate insulating layers in one-to-one correspondence with the plurality of first doped well regions and a plurality of third sacrificial layers in the second device region. The substrate is etched using the hard mask layer to form a plurality of first isolation trenches in one-to-one correspondence with the plurality of first openings and a plurality of second isolation trenches in one-to-one correspondence with the plurality of second openings in the second device region. The hard mask layer is removed.

In some implementations, the second doped well regions are formed in the substrate with each of the second doped well regions being located between every two neighboring second isolation trenches, a depth of the second doped well region in the vertical direction being less than the depth of the first doped well region in the vertical direction.

In some implementations, an insulating material is filled in the first isolation trenches and the second isolation trenches.

In a further aspect, a method for fabricating a semiconductor device is disclosed. A first removal operation is performed on a substrate to form a first trench in a first device region of the substrate. A first doped well region is formed in the first device region adjacent to the first trench. A second removal operation is performed on the substrate to deepen the first trench in the first device region and form a second trench in a second device region of the substrate. A second doped well region is formed in the second device region adjacent to the first trench.

In some implementations, a first isolation structure is formed in the first trench and a second isolation structure is formed in the second trench.

In some implementations, a first sacrificial layer is formed on the substrate. a first implantation operation is performed on portions of the substrate adjacent to the first trench. The first sacrificial layer is removed. A second sacrificial layer is formed on the substrate. A second implantation operation is performed on portions of the substrate adjacent to the first trench. The second sacrificial layer is removed.

In some implementations, the second sacrificial layer in the first device region of the substrate is removed.

In some implementations, an insulating layer is formed on the substrate in the first device region. A hard mask layer is formed on the insulating layer in the first device region and on the second sacrificial layer in the second device region. Portions of the insulating layer in the first device region and portions of the second sacrificial layer in the second device region are removed. The first trench in the first device region is deepened and the second trench in the second device region is formed with the hard mask layer. The hard mask layer is removed.

In some implementations, the insulating layer is formed over the first doped well regions and on inner surfaces of the first trench.

In some implementations, a depth of the first trench is larger than a depth of the second trench.

In some implementations, a width of the second trench at a top of the second trench is larger than a width of the first trench at a top of the first trench.

In still a further aspect, a semiconductor device is disclosed. The semiconductor device includes a substrate having a first device region and a second device region; at least one first isolation structure in the substrate in the first device region; and at least one second isolation structure in the substrate in the second device region. A depth of the first isolation structure in a vertical direction perpendicular to the substrate is larger than a depth of the second isolation structure in the vertical direction.

In some implementations, a width of the first isolation structure and a width of the second isolation structure in a lateral direction parallel to the substrate decrease respectively in a direction away from a surface of the substrate, and the width of the second isolation structure at a top of the second isolation trench is larger than the width of the first isolation structure at a top of the first isolation trench.

In some implementations, the number of the first isolation structure and the second isolation structure are plurality respectively, and the first isolation structure and the second isolation structure are disposed separately from each other. The semiconductor device further includes first doped well regions each being located between two adjacent first isolation structures; and second doped well regions each being located between two adjacent second isolation structures, a depth of the second doped well region in the vertical direction being less than a depth of the first doped well region in the vertical direction.

In some implementations, the first isolation structure includes a first isolation trench and an insulating material filled in the first isolation trench and the second isolation structure includes a second isolation trench and the insulating material filled in the second isolation trench.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 1 illustrates a flowchart of a method of fabricating an exemplary semiconductor device, according to some aspects of the present disclosure.

FIGS. 2a-2c illustrate structural diagrams showing the process of fabricating an exemplary semiconductor device, according to some aspects of the present disclosure.

FIG. 3 illustrates a flowchart of a method of fabricating first doped well regions, according to some aspects of the present disclosure.

FIGS. 4a-4e illustrate structural diagrams showing the process of fabricating first doped well regions, according to some aspects of the present disclosure.

FIG. 5 illustrates a flowchart of a method of fabricating a first isolation trench and a second isolation trench, according to some aspects of the present disclosure.

DETAILED DESCRIPTION

Figure 2B:
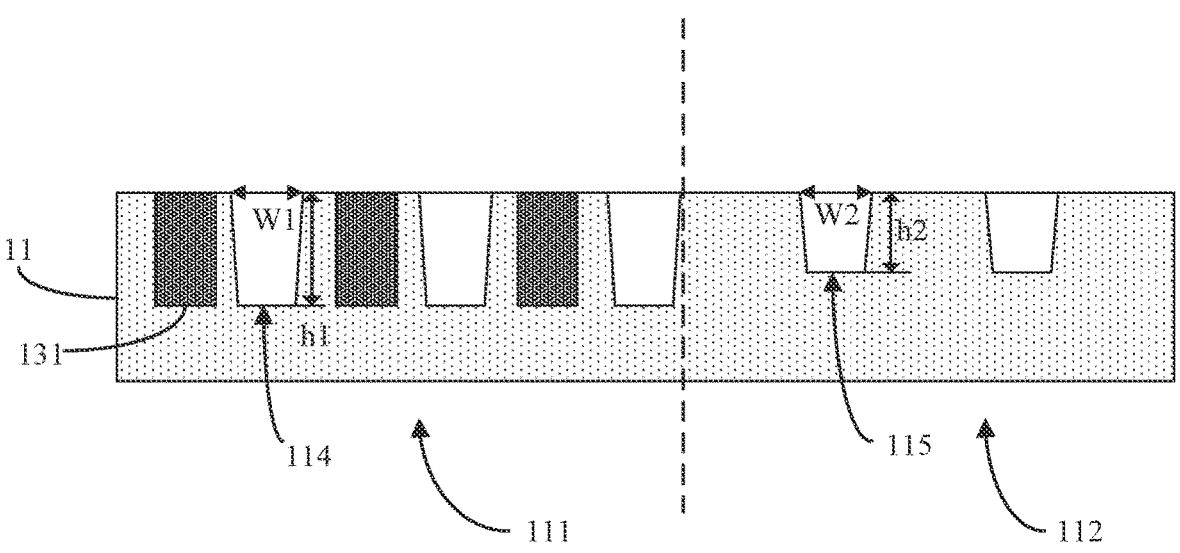

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

Figure 2C:
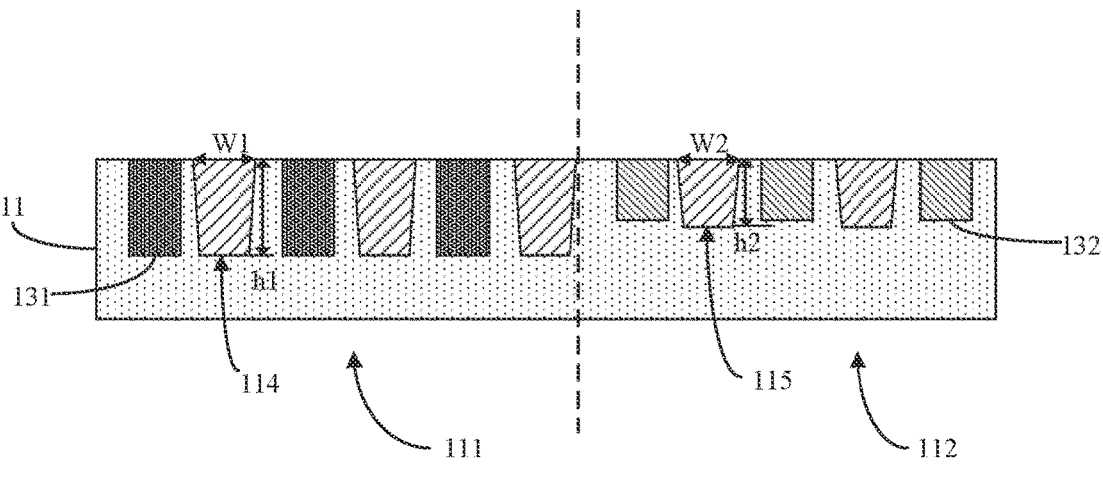

Please refer to FIG. 1, which is a flowchart of a method of fabricating a semiconductor device, according to some aspects of the present disclosure. FIGS. 2a-2c illustrate structural diagrams showing the process of fabricating a semiconductor device, according to some aspects of the present disclosure.

In step S1, a substrate 11 is provided. In some implementations, the substrate 11 includes a first device region 111 and a second device region adjacent to the first device region 111. In some implementations, the substrate 11 may be a semiconductor substrate, for example, silicon (Si), germanium (Ge), SiGe substrate, silicon on insulator (SOI) or germanium on insulator (GOI) or the like. In some implementations, the semiconductor substrate may be a substrate comprising any other element semiconductor or compound semiconductor, or may be a stack layer structure, e.g., Si/SiGe or the like.

In some implementations, the first device region 111 corresponds to a device having relatively high operating voltage and the second device region 112 corresponds to a device having relatively low operating voltage, so that there are some differences between the first device region 111 and the second device region 112. For example, a junction depth of the first device region 111 is deeper than that of the second device region 112, a thickness of a gate insulating layer in the first device region 111 is larger than a thickness of a gate insulating layer in the second device region 112, and a thickness of a gate in the first device region 111 is larger than a thickness of a gate in the second device region 112 or the like.

In step S2, the substrate 11 in the first device region 111 is etched to form at least one first trench 113.

In some implementations, the substrate 11 may be etched using an etching process through a mask to form at least one first trench 113 with a depth of h0. Due to the effects of the etching process, the width of the first trench 113 in the lateral direction parallel to the substrate 11 decreases in the direction away from the surface of the substrate 11, as shown in FIG. 2a. It is to be noted that, in this embodiment, the phrase "depth of the first trench 113" refers to a height from an upper surface of the substrate 11 to a bottom surface of the first trench 113, and any other "depth" refers to a depth of extension into the substrate 11 from the upper surface of the substrate 11 in a vertical direction. The term "vertical direction" means the direction perpendicular to the substrate 11.

Please refer to step S3 in FIG. 1 and FIG. 2b. In step S3, first doped well regions 131 are formed in the substrate 11 with each of the first doped well regions being located between two adjacent first trenches 113.

In some implementations, the plurality of first doped well regions 131 are formed by ion implanting the substrate 11 among the first trenches 113 through a mask.

Please refer to step S4 in FIG. 1 and FIG. 2b. In step S4, the substrate 11 in both the first device region 111 and the second device region 112 is etched to form at least one first isolation trench 114 at the positions corresponding to the at least one first trench 113 and form at least one second isolation trench 115 in the second device region 112.

The present disclosure takes forming a plurality of first isolation trenches 114 and a plurality of second isolation trenches 115 as an example. In some implementations, the substrate 11 in both the first device region 111 and the second device region 112 is etched continuously to form a plurality of first isolation trenches 114 at the positions corresponding to the first trenches 113 and form a plurality of second isolation trenches 115 in the second device region 112. Since the substrate 11 in the first device region 111 has been etched for a first time in the step S2 and the substrate 11 in both the first device region 111 and in the second device region 112 has been etched for a second time and of the same etching depth in the step S4, while a first etching and a second etching occur at the same position in the first device region 111, i.e., the first isolation trench 114 is at the same position as the first trench 113, thus a depth h1 of the eventually formed first isolation trench 114 is deeper than a depth h2 of the second isolation trench 115, and the difference between the depth h1 of the first isolation trench 114 and the depth h2 of the second isolation trench 115 is equal to a depth h0 of the first trench 113 shown in FIG. 2a. In some implementations, the depth h1 of the first isolation trench 114 may be equal to the depth of the first doped well region 131.

Due to the effects of the etching process, the width of the first isolation trench 114 and the width of the second isolation trench 115 in a lateral direction parallel to the substrate 11 decrease respectively in the direction away from the surface of the substrate 11, i.e., the first isolation trench 114 and the second isolation trench 115 each have a cross-sectional shape of trapezoid. Therefore, to ensure a certain width at the bottom of any of the isolation trenches, the deeper the isolation trench is, the wider the opening at the top of the isolation trench and the larger the footprint occupied by the isolation trench is. Since the depth h2 of the second isolation trench 115 is less than the depth h1 of the first isolation trench 114, the width W2 of the second isolation trench 115 at its top is less than the width W1 of the first isolation trench 114 at its top, enabling the footprint of the second device region 112 to be reduced.

Please refer to step S5 in FIG. 1 and FIG. 2c. In step S5, second doped well regions 132 are formed in the substrate 11 with each of the second doped well regions 132 being located between two adjacent second isolation trenches 115. In some implementations, a depth of the second doped well region 132 in the vertical direction is less than the depth of the first doped well region 131 in the vertical direction.

In some implementations, a plurality of second doped well regions 132 are formed by ion implanting the substrate 11 among the second isolation trenches 115 through a mask. Since high-voltage devices are disposed in the first device region 111 and require relatively deeper junction depth while low-voltage devices are disposed in the second device region 112 and require relatively shallow junction depth, the junction depth of the second doped well region 132 is less than that of the first doped well region 131. It is to be noted that the term "junction depth" refers to the depth of a doped well region in the vertical direction. In some implementations, the depth of the second doped well region 132 may be equal to the depth h2 of the second isolation trench 115.

The method of fabricating a semiconductor device provided in this implementation may further include filling an insulating material in the first isolation trench 114 and the second isolation trench 115 to obtain better performance of insulation, as shown in FIG. 2c.

In the method of fabricating a semiconductor device provided in the present disclosure, firstly etching the substrate 11 in the first device region 111 to the depth h0 to form the first trench 113 and then etching the substrate 11 in both the first device region 111 and in the second device region 112 to form the first isolation trench 114 with a deeper depth and at the position of the first trench 113 and form the second isolation trench 115 in the second device region 112, so that the depth h1 of the first isolation trench 114 is equal to the sum of the depth h0 of the first trench 113 and the depth h2 of the second isolation trench 115. Since the junction depth of the first doped well region 131 (i.e. the depth of the first doped well region 131) needs to be larger than the junction depth of the second doped well region 132, the first isolation trench 114 formed with deeper junction depth may provide a better isolation to the plurality of first doped well regions 131. Meanwhile, since the junction depth of the second doped well region 132 is relatively shallow, the second isolation trench 115 formed shallower than the first isolation trench 114 may satisfy the requirement for isolation of the plurality of second doped well regions 132 and reduce the depth of the second isolation trench 115, thus reducing the footprint of the second device region 112 and in turn reducing the footprint of the whole semiconductor device.

Please refer to FIG. 3, which is a flowchart of a method of fabricating a first doped well region provided in some implementations of the present disclosure. FIGS. 4a-4e illustrate structural diagrams showing the process of fabricating a first doped well region in various stages, according to some aspects of the present disclosure. The method of fabricating a first doped well region includes the following steps S31-S36. For ease of understanding, the same reference numerals are used to designate the same structures as those in other implementations.

In step S31, a first sacrificial layer 121 is formed on the substrate 11. In some implementations, the first sacrificial layer 121 may be formed after the step S2 (based on FIG. 2a) and, as shown in FIG. 4a, has a portion on the inner surface of the first trench 113. The first sacrificial layer 121 may have materials including silicon oxide. In some implementations, the first sacrificial layer 121 may be formed before the formation of the first trench 113 (i.e., before FIG. 2a).

In step S32, the first ion implantation is performed on portions of the substrate 11 with each portion being located between two adjacent first trenches 113.

Figure 4B:
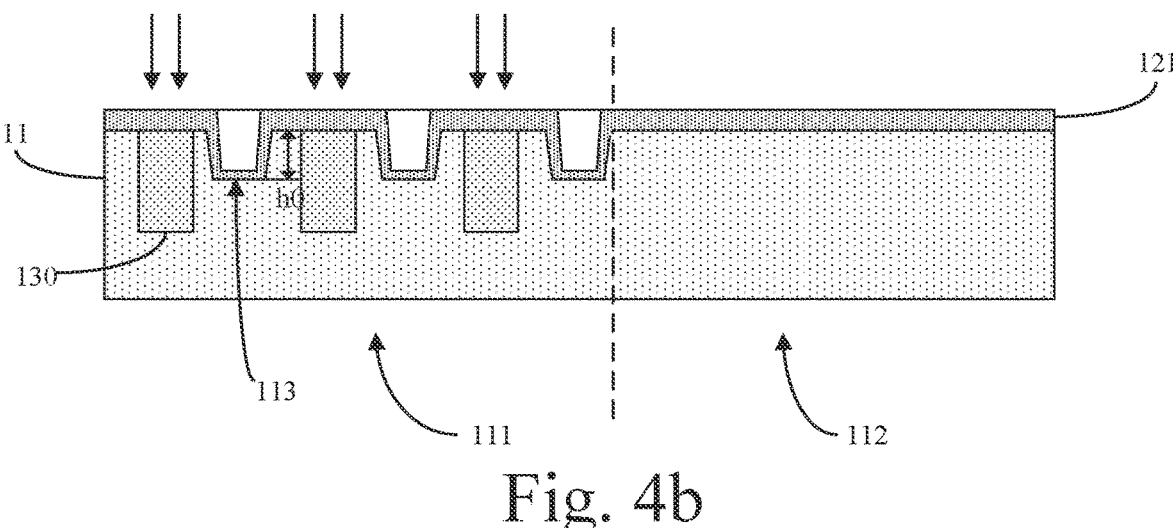

As shown in FIG. 4b, since the first device region 111 is a high-voltage device region and the energy for the ion implantation in the first device region 111 is very high, the first ion implantation results in an initial first doped well region 130 and the first sacrificial layer 121 is used to protect the substrate 11 from being damaged during the first ion implantation.

Figure 4C:
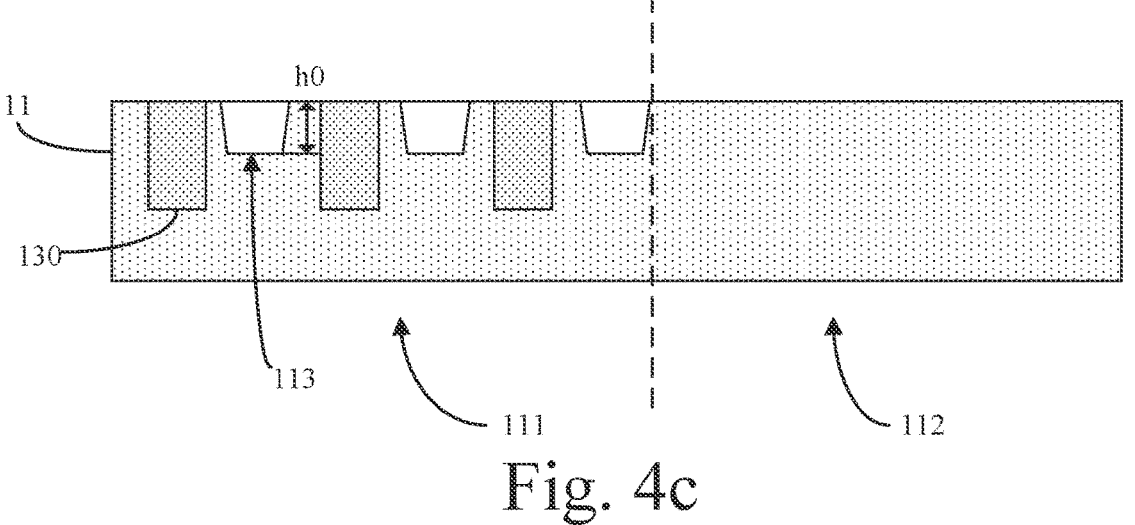

In step S33, the first sacrificial layer 121 is removed, as shown in FIG. 4c. In some implementations, the first sacrificial layer 121 may be removed by wet etching using hydrofluoric acid.

Figure 4D:
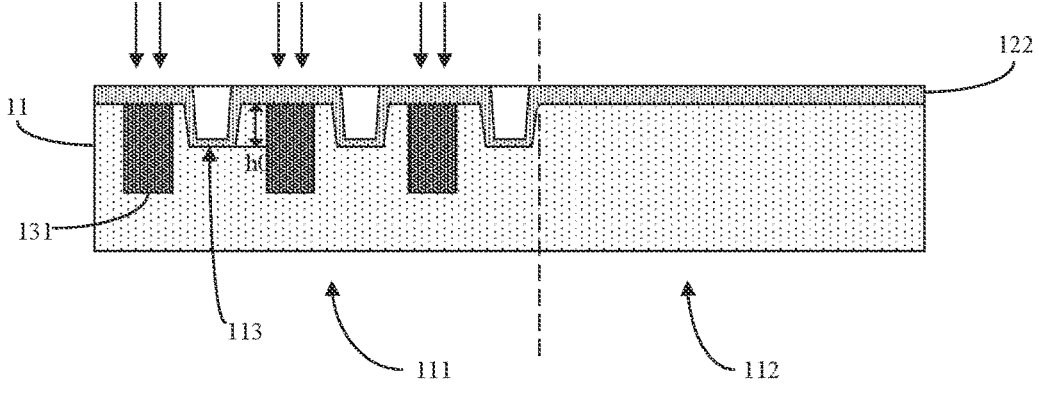

In step S34, a second sacrificial layer 122 is formed on the first substrate 11 in both the first device region 111 and the second device region 112, as shown in FIG. 4d. Since the first sacrificial layer 121 may be damaged by the first ion implantation in the step S32, the first sacrificial layer 121 would be removed and a second sacrificial layer 122 would be deposited to protect the substrate 11 during the subsequent second ion implantation. In some implementations, the material of the second sacrificial layer 122 may be silicon oxide.

In step S35, the second ion implantation is performed on portions of the substrate 11 with each portion being located between two adjacent first trenches 113, so that first doped well regions 131 each being located between every two neighboring first trenches 113 are formed.

In some implementations, the first ion implantation and the second ion implantation are different in their different implanted ions, different areas or positions of the implantation or all the three differences. Therefore, ion implantation needs to be performed twice to form the first doped well regions 131 that satisfy device requirements.

In step S36, the second sacrificial layer 122 in the first device region 111 is removed, as shown in FIG. 4e.

In the method of forming the first doped well region 131 in the present disclosure, ion implantation is performed twice to form a plurality of first doped well regions 131 and a sacrificial layer is formed before each of the ion implantation, so that the substrate 11 may be protected from being damaged and the first doped well regions 131 can satisfy device requirements.

Please refer to FIG. 5, which is a flowchart of a method of fabricating a first isolation trench and a second isolation trench, according to some aspects of the present disclosure. Also please refer to FIGS. 6a-6e, which are structural diagrams illustrating the process of fabricating a first isolation trench and a second isolation trench, according to some aspects of the present disclosure. The method of fabricating a first isolation trench and a second isolation includes the following steps S41-S45.

Figures 6A, 6B, 6C:
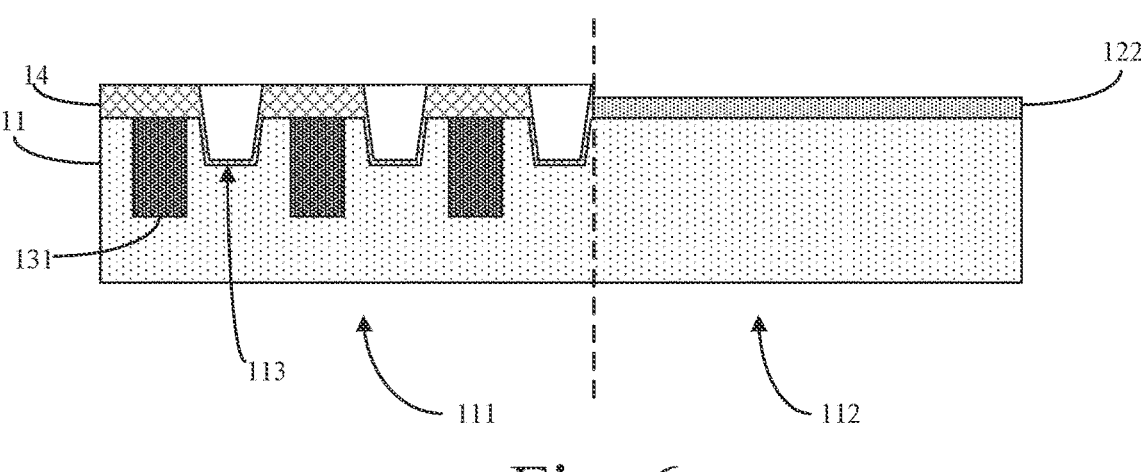
FIGS. 6a-6e illustrate structural diagrams showing the process of fabricating a first isolation trench and a second isolation trench, according to some aspects of the present disclosure.

In step S41, an insulating layer 14 is formed on the substrate 11 in the first device region 111. In some implementations, the insulating layer 14 may be located over the first doped well region 131 and on the inner surface of the first trench 113. As shown in FIG. 6a, the insulating layer 14 may be formed by oxidizing the surface of the substrate 11 using furnace oxidation process.

In step S42, a hard mask layer 15 is formed on the insulating layer 14 and on the surface of the second sacrificial layer 122 at the second device region 112. The hard mask layer 15 has a plurality of first openings 153 in one-to-one correspondence with the plurality of first trenches 113 and a plurality of second openings 154 disposed separately corresponding to the second device region 112. As shown in FIG. 6b, the hard mask layer 15 may include a light absorbing layer 151 (e.g., silicon nitride) located on the insulating layer 14 or the second sacrificial layer 122 and an anti-reflection layer 152 (e.g., silicon oxynitride) on the light absorbing layer 151. In some implementations, a layer of silicon nitride, a layer of silicon oxynitride and a layer of photoresist are first formed sequentially and the layer of photoresist is patterned using a mask to form a patterned layer of photoresist, which is used to form the hard mask layer 15 with the first openings 153 and the second openings 154.

In step S43, the insulating layer 14 and the second sacrificial layer 122 in the second device region 112 are etched using the hard mask layer 15 to form a plurality of first gate insulating layers 141 in one-to-one correspondence with the plurality of first doped well regions 131 and form a plurality of third sacrificial layers 123 located in the second device region 112. It is to be noted that the insulating layer 14 may be silicon dioxide and thus may serve as a gate insulating layer. As shown in FIG. 6c, the portions of the insulating layer 14 in the first trenches 113 are removed through the first openings 153 to form the plurality of first gate insulating layers 141; and the portions of the second sacrificial layer 122 at the bottoms of the second openings 154 are removed through the second openings 154 to form the plurality of third sacrificial layers 123, which can be used to protect the substrate 11 during the formation of doped well regions in the second device region 112.

Figure 6D:
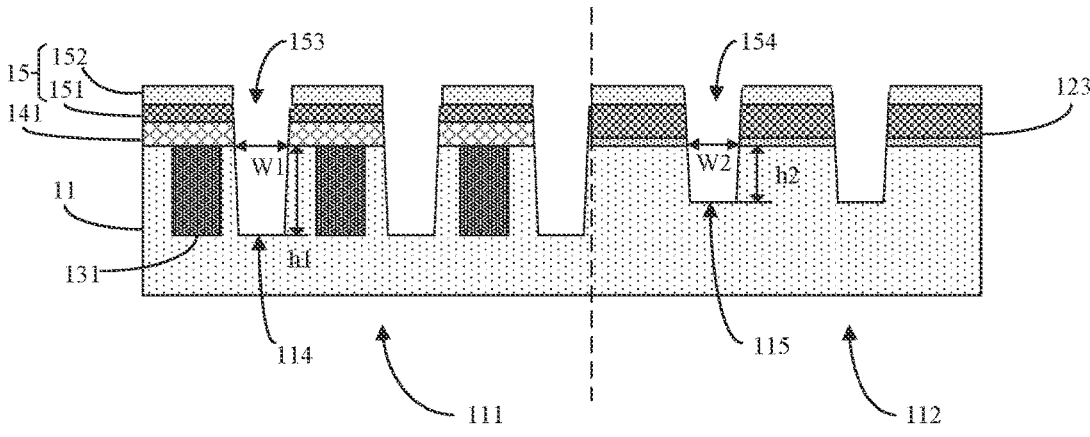

In step S44, the substrate 11 is etched using the hard mask layer 15 to form a plurality of first isolation trenches 114 in one-to-one correspondence with the plurality of first openings 153 and form a plurality of second isolation trenches 115 in one-to-one correspondence with the plurality of second openings 154 in the second device region 112. As shown in FIG. 6d, since the etching process may result in an angle of inclination, the width of the first isolation trench 114 and the width of the second isolation trench 115 in a lateral direction parallel to the substrate decrease respectively in a direction away from the surface of the substrate 11 (i.e., from top to bottom). In order to ensure the bottom width of the first isolation trench 114 and the bottom width of the second isolation trench 115 to satisfy certain requirements, the deeper the first isolation trench 114 and the second isolation trench 115 are, the wider they are at their tops. Since the depth h2 of the second isolation trench 115 is less than the depth h1 of the first isolation trench 114, the width W2 of the second isolation trench 115 at its top is less than the width W1 of the first isolation trench 114 at its top. It is to be noted that dimensions of the structures shown in the figures are not drawn to scale with respect to actual structures.

In the conventional structures, the depth h2 of the second isolation trench 115 is the same as the depth h1 of the first isolation trench 114, so that the width W2 of the second isolation trench 115 at its top is the same as the width W1 of the first isolation trench 114 at its top. In contrast with the conventional structures, in some implementations of the present disclosure, the width W2 of the second isolation trench 115 at its top is reduced, i.e. less than the width W1 of the first isolation trench at its top, so that the second isolation trenches 115 fabricated in the present embodiment may reduce the footprint of the second device region 112.

Figure 6E:
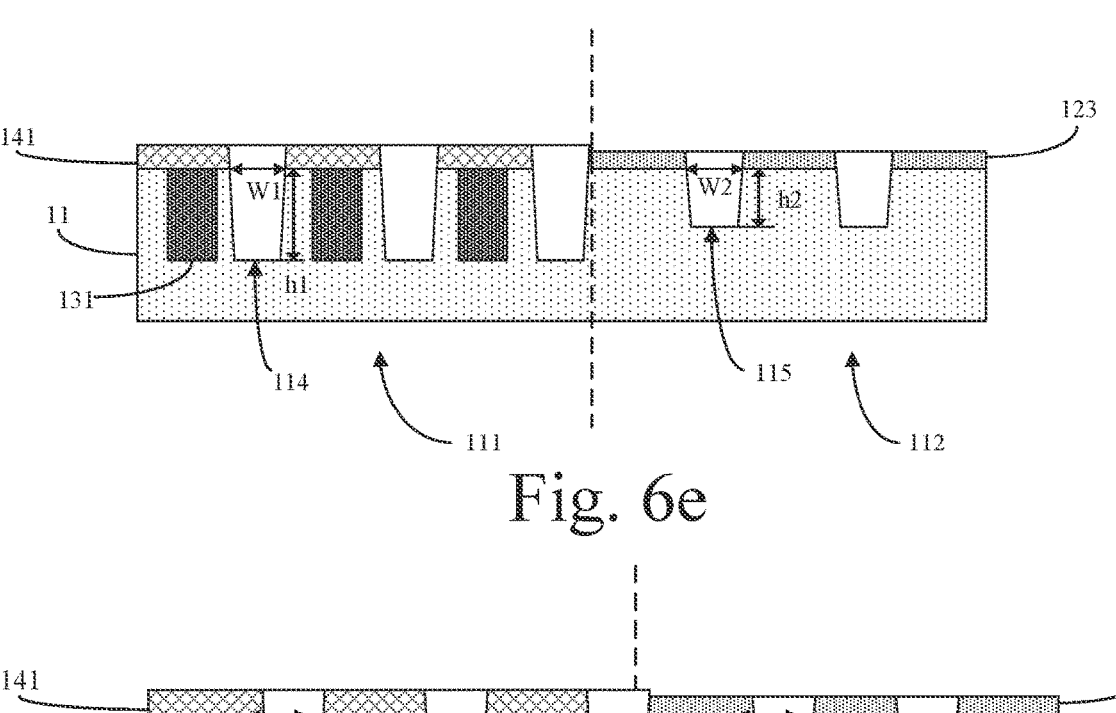

In step S45, the hard mask layer 15 is removed, as shown in FIG. 6e. In some implementations, the hard mask layer 15 may be removed by wet etching using phosphoric acid.

Figure 6F:
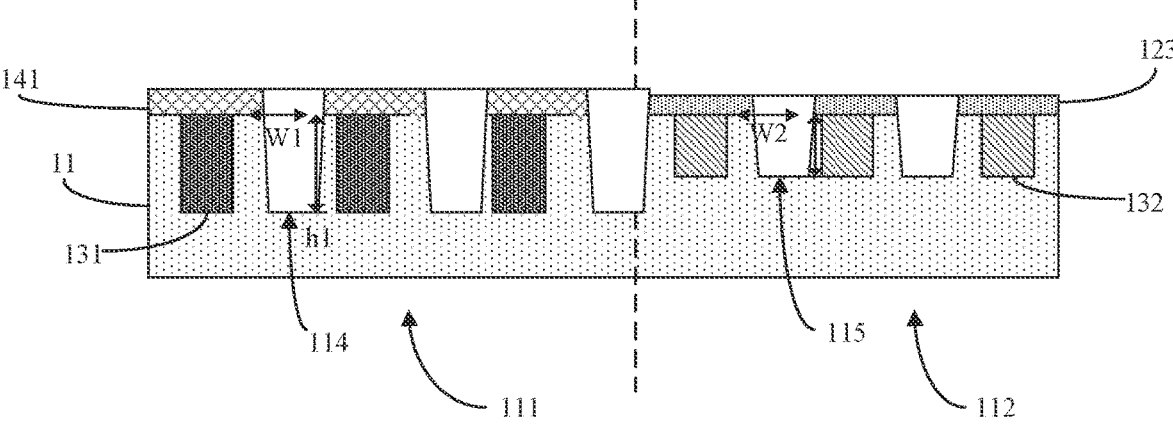
FIGS. 6f-6h illustrate structural diagrams showing a process of fabricating a first isolation structure and a second isolation structure, according to some aspects of the present disclosure.
Figure 6G:
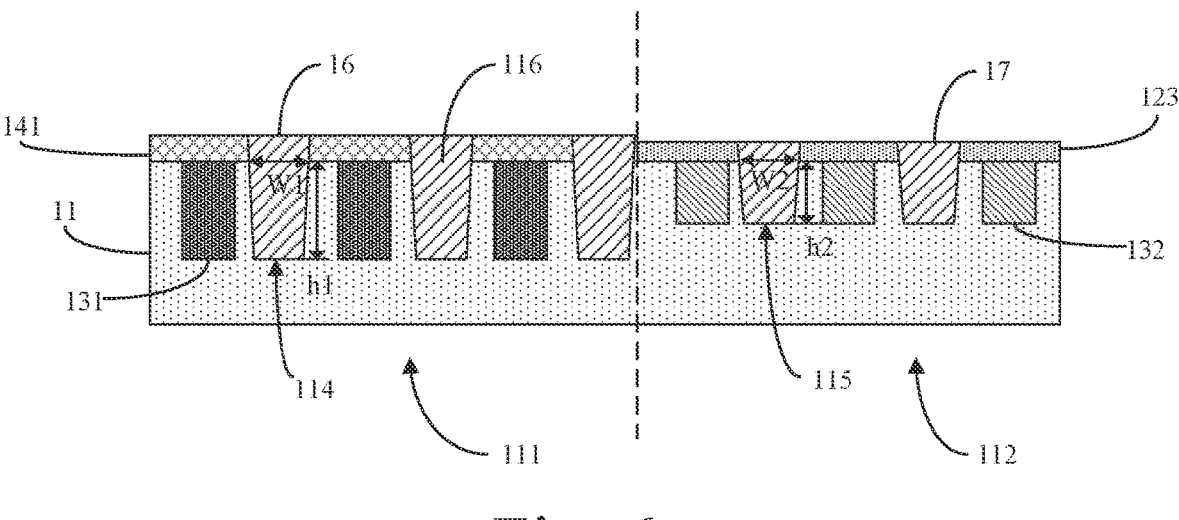
Figure 6H:
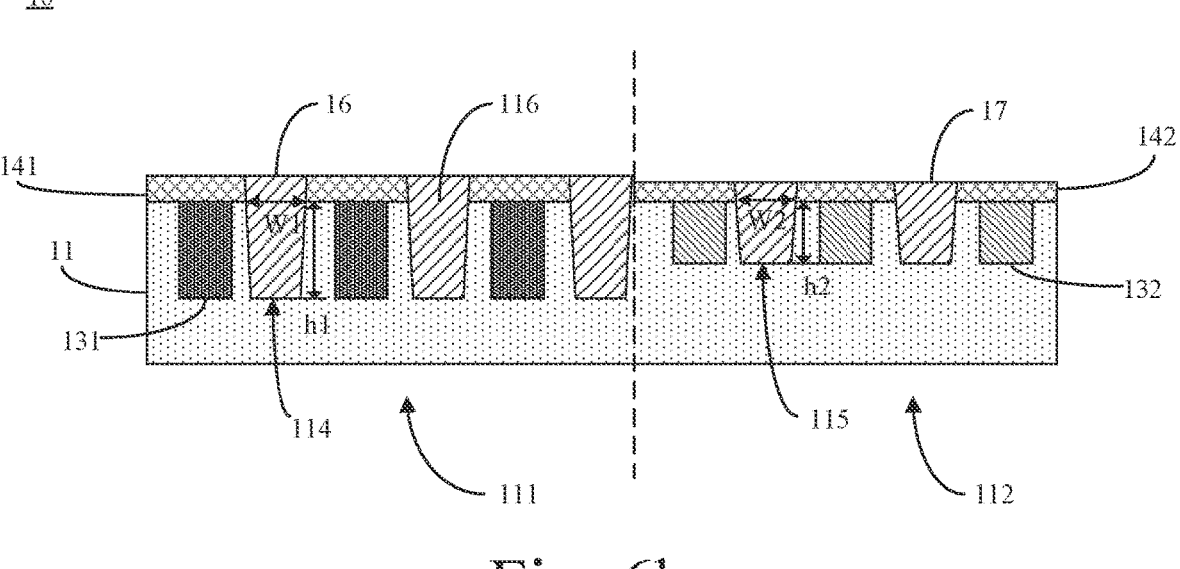

Please refer to FIGS. 6F-6h, which are structural diagrams illustrating the process of fabricating a first isolation structure and a second isolation structure provided in the second embodiment of the present disclosure. In some implementations, after the formation of the first isolation trench 114 and the second isolation trench 115, the method of fabricating a semiconductor device may further include the following operations. As shown in FIG. 6f, second doped well regions 132 each being located between every two neighboring second isolation trenches 115 are formed in the second device region 112, the process of forming the second doped well regions 132 may be the same as the first doped well regions 131 (with reference to steps S31-S36). It can be understood that the third sacrificial layer 123 can protect the surface of the substrate 11 from being damaged during ion implantation for the formation of the second doped well regions 132. As shown in FIG. 6g, an insulating material 116 may be filled into the first isolation trench 114 and the second isolation trench 115 to form a first isolation structure 16 and a second isolation structure 17. As shown in FIG. 6h, the third sacrificial layer 123 is removed and a second gate insulating layer 142 is formed on the surface of the substrate 11 in the second device region 112. Gates are formed on the first gate insulating layer 141 and the second gate insulating layer 142.

In the method of fabricating the first isolation trench 114 and the second isolation trench 115 provided in the second embodiment of the present disclosure, the first gate insulating layer 141 is formed, so that process steps can be reduced.

In the method of fabricating a semiconductor device provided in the present disclosure, firstly providing a substrate 11 having a first device region 111 and a second device region 112 adjacent to the first device region 111 and then etching the substrate 11 in the first device region 111 to form a plurality of first trenches 113; and subsequently etching the substrate 11 in both the first device region 111 and the second device region 112 to form a plurality of first isolation trenches 114 corresponding to the plurality of first trench 113 and form a plurality of second isolation trenches 115 in the second device region 112. Herein a depth h1 of the first isolation trench 114 in a vertical direction perpendicular to the substrate 11 is larger than a depth h2 of the second isolation trench 115 in the vertical direction, and the difference between the depth h1 of the first isolation trench 114 and the depth h2 of the second isolation trench 115 is equal to a depth h0 of the first trench 113 in the vertical direction. In some implementations, the first isolation trench 114 and the second isolation trench 115 of different depths can be formed in the first device region 111 and the second device region 112 respectively, so that the depths of the first isolation trench 114 and the second isolation trench 115 can both satisfy the requirements of the first device region 111 and the second device region 112 and reduce the depth of the second isolation trench 115 and thereby reduce the footprint of the second device region 112, and in turn reduce the footprint of the CMOS.

The present disclosure also provides a semiconductor device, which can be fabricated by the method of fabricating a semiconductor device described above and thus may be illustrated by FIG. 6h.

In some implementations, the semiconductor device 10 includes: a substrate 11 having a first device region 111 and a second device region 112 adjacent to the first device region 111; at least one first isolation structure 16 located in the substrate 11 in the first device region 111; at least one second isolation structure 17 located in the substrate 11 in the second device region 112, wherein a depth h1 of the first isolation structure 16 in a vertical direction perpendicular to the substrate 11 is larger than a depth h2 of the second isolation structure 17 in the vertical direction.

In some implementations, a width of the first isolation structure 16 and a width of the second isolation structure 17 in a lateral direction parallel to the substrate 11 decrease respectively in a direction away from a surface of the substrate 11, and a width W2 of the second isolation structure 17 at its top is less than a width W1 of the first isolation structure 16 at its top.

In some implementations, the first isolation structure 16 includes a first isolation trench 114 and an insulating material 116 filled in the first isolation trench 114 and the second isolation structure 17 includes a second isolation trench 115 and the insulating material 116 filled in the second isolation trench 115.

In some implementations, the number of the first isolation structure 16 and the second isolation structure 17 are plurality respectively, and the first isolation structure 16 and the second isolation structure 17 are disposed separately from each other. The semiconductor device 10 further includes: first doped well regions 131 each being located between every two neighboring first isolation structures 16; second doped well regions 132 each being located between every two neighboring second isolation structures 17, a depth of the second doped well region 132 in the vertical direction being less than a depth of the first doped well region 131 in the vertical direction.

In some implementations, the semiconductor device 10 may further includes: a plurality of first gate insulating layers 141 on the substrate 11 and in one-to-one correspondence with the plurality of first doped well regions 131; a plurality of second gate insulating layers 142 on the substrate 11 and in one-to-one correspondence with the plurality of second doped well regions 132, wherein a thickness of the first gate insulating layer 141 is larger than that of the second gate insulating layer 142.

The semiconductor device is fabricated by the method of fabricating a semiconductor device described above and thus has the same beneficial effects.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

The invention claimed is:

1. A method of fabricating a semiconductor device, comprising:
   providing a substrate having a first device region and a second device region;
   etching the substrate in the first device region to form a plurality of first trenches;
   forming first doped well regions in the substrate with each of the first doped well regions being located between two adjacent first trenches of the plurality of first trenches;
   after forming the first doped well regions, etching the substrate in both the first device region and the second device region to form at least one first isolation trench at positions corresponding to the plurality of first trenches and form at least one second isolation trench in the second device region; and
   forming second doped well regions in the substrate with each of the second doped well regions being located between every two neighboring second isolation trenches, a depth of the second doped well region in a vertical direction being less than the depth of the first doped well region in the vertical direction, wherein a depth of the first isolation trench in a vertical direction perpendicular to the substrate is larger than a depth of the second isolation trench in the vertical direction.

2. The method of claim 1, wherein a width of the first isolation trench and a width of the second isolation trench in a lateral direction parallel to the substrate decrease respectively in a direction away from a surface of the substrate, and the width of the second isolation trench at a top of the second isolation trench is larger than the width of the first isolation trench at a top of the first isolation trench.

3. The method of claim 1, wherein a difference between the depth of the first isolation trench and the depth of the second isolation trench is equal to a depth of the first trench in the vertical direction.

4. The method of claim 1, wherein numbers of the first trench, the first isolation trench and the second isolation trench are plurality respectively, and the first trench, the first isolation trench and the second isolation trench are disposed separately from each other, and the plurality of first trenches are in one-to-one correspondence with the at least one first isolation trench.

5. The method of claim 1, wherein forming the first doped well regions in the substrate with each of the first doped well regions being located between two adjacent first trenches, comprises:
   forming a first sacrificial layer on the substrate;
   performing a first ion implantation on portions of the substrate with each portion being located between two adjacent first trenches;
   removing the first sacrificial layer;
   forming a second sacrificial layer on the substrate at both the first device region and the second device region;
   performing a second ion implantation on the portions of the substrate with each portion being located between two adjacent first trenches, to form the first doped well regions being located between two adjacent first trenches; and
   removing the second sacrificial layer in the first device region.

6. The method of claim 5, wherein etching the substrate in the first device region and the second device region, comprises:
   forming an insulating layer on the substrate in the first device region, the insulating layer being located over the first doped well regions and on inner surfaces of the first trenches;
   forming a hard mask layer on the insulating layer and on a surface of the second sacrificial layer in the second device region, the hard mask layer having a plurality of first openings in one-to-one correspondence with the plurality of first trenches and a plurality of second openings disposed separately corresponding to the second device region;
   etching the insulating layer and the second sacrificial layer in the second device region using the hard mask layer to form a plurality of first gate insulating layers in one-to-one correspondence with the first doped well regions and a plurality of third sacrificial layers in the second device region;
   etching the substrate using the hard mask layer to form a plurality of first isolation trenches in one-to-one correspondence with the plurality of first openings and a plurality of second isolation trenches in one-to-one correspondence with the plurality of second openings in the second device region; and
   removing the hard mask layer.

7. The method of claim 1, further comprising:

filling an insulating material in the first isolation trenches and the second isolation trenches.

8. A method of fabricating a semiconductor device, comprising:

performing a first removal operation on a substrate to form a first trench in a first device region of the substrate;

forming a first doped well region in the first device region adjacent to the first trench, comprising:

forming a first sacrificial layer on the substrate;

performing a first implantation operation on portions of the substrate adjacent to the first trench;

removing the first sacrificial layer;

forming a second sacrificial layer on the substrate;

performing a second implantation operation on portions of the substrate adjacent to the first trench; and removing the second sacrificial layer;

after forming the first doped well region, performing a second removal operation on the substrate to deepen the first trench in the first device region and form a second trench in a second device region of the substrate; and forming a second doped well region in the second device region adjacent to the first trench.

9. The method of claim 8, further comprising:

forming a first isolation structure in the first trench and a second isolation structure in the second trench.

10. The method of claim 8, wherein removing the second sacrificial layer, comprises:

removing the second sacrificial layer in the first device region of the substrate.

11. The method of claim 10, wherein performing the second removal operation on the substrate to deepen the first trench in the first device region and form the second trench in the second device region of the substrate, comprises:

forming an insulating layer on the substrate in the first device region;

forming a hard mask layer on the insulating layer in the first device region and on the second sacrificial layer in the second device region;

removing portions of the insulating layer in the first device region and portions of the second sacrificial layer in the second device region;

deepening the first trench in the first device region and forming the second trench in the second device region with the hard mask layer; and removing the hard mask layer.

12. The method of claim 11, wherein forming the insulating layer on the substrate in the first device region, comprises:

forming the insulating layer over the first doped well regions and on inner surfaces of the first trench.

13. The method of claim 8, wherein a depth of the first trench is larger than a depth of the second trench.

14. The method of claim 8, wherein a width of the second trench at a top of the second trench is larger than a width of the first trench at a top of the first trench.

15. A method of fabricating a semiconductor device, comprising:

providing a substrate having a first device region and a second device region;

etching the substrate in the first device region to form a plurality of first trenches;

forming first doped well regions in the substrate with each of the first doped well regions being located between two adjacent first trenches of the plurality of first trenches, comprising:

forming a first sacrificial layer on the substrate;

performing a first ion implantation on portions of the substrate with each portion being located between two adjacent first trenches;

removing the first sacrificial layer;

forming a second sacrificial layer on the substrate at both the first device region and the second device region;

performing a second ion implantation on the portions of the substrate with each portion being located between two adjacent first trenches, to form the first doped well regions being located between two adjacent first trenches; and removing the second sacrificial layer in the first device region; and after forming the first doped well regions, etching the substrate in both the first device region and the second device region to form at least one first isolation trench at positions corresponding to the plurality of first trenches and form at least one second isolation trench in the second device region, wherein a depth of the first isolation trench in a vertical direction perpendicular to the substrate is larger than a depth of the second isolation trench in the vertical direction.

16. The method of claim 15, wherein etching the substrate in the first device region and the second device region, comprises:

forming an insulating layer on the substrate in the first device region, the insulating layer being located over the first doped well regions and on inner surfaces of the first trenches;

forming a hard mask layer on the insulating layer and on a surface of the second sacrificial layer in the second device region, the hard mask layer having a plurality of first openings in one-to-one correspondence with the plurality of first trenches and a plurality of second openings disposed separately corresponding to the second device region;

etching the insulating layer and the second sacrificial layer in the second device region using the hard mask layer to form a plurality of first gate insulating layers in one-to-one correspondence with the first doped well regions and a plurality of third sacrificial layers in the second device region;

etching the substrate using the hard mask layer to form a plurality of first isolation trenches in one-to-one correspondence with the plurality of first openings and a plurality of second isolation trenches in one-to-one correspondence with the plurality of second openings in the second device region; and removing the hard mask layer.

17. The method of claim 15, wherein a width of the first isolation trench and a width of the second isolation trench in a lateral direction parallel to the substrate decrease respectively in a direction away from a surface of the substrate, and the width of the second isolation trench at a top of the second isolation trench is larger than the width of the first isolation trench at a top of the first isolation trench.

18. The method of claim 15, wherein a difference between the depth of the first isolation trench and the depth of the second isolation trench is equal to a depth of the first trench in the vertical direction.

19. The method of claim 15, wherein numbers of the first trench, the first isolation trench and the second isolation trench are plurality respectively, and the first trench, the first isolation trench and the second isolation trench are disposed separately from each other, and the plurality of first trenches are in one-to-one correspondence with the at least one first isolation trench.

\* \* \* \* \*